(12) United States Patent
Lasser

(10) Patent No.: US 8,339,855 B2
(45) Date of Patent: *Dec. 25, 2012

(54) REVERSE ORDER PAGE WRITING IN FLASH MEMORIES

(75) Inventor: Menahem Lasser, Kohav Yair (IL)

(73) Assignee: SanDisk IL Ltd., Kfar Saba (IL)

( * ) Notice: Subject to any disclaimer, the term of this patent is extended or adjusted under 35 U.S.C. 154(b) by 44 days.

This patent is subject to a terminal disclaimer.

(21) Appl. No.: 12/961,431

(22) Filed: Dec. 6, 2010

(65) Prior Publication Data

US 2011/0096603 A1    Apr. 28, 2011

Related U.S. Application Data

(63) Continuation of application No. 12/139,545, filed on Jun. 16, 2008, now Pat. No. 7,848,144.

(51) Int. Cl.
*G11C 11/34* (2006.01)

(52) U.S. Cl. .......... 365/185.12; 365/185.09; 365/185.23

(58) Field of Classification Search ............. 365/185.12, 365/185.09, 185.23, 185.19, 185.17, 185.21, 365/189.09, 185.11, 185.03, 185.18, 189.05, 365/230.08
See application file for complete search history.

(56) References Cited

U.S. PATENT DOCUMENTS

| | | |
|---|---|---|
| 5,101,378 A | 3/1992 | Radjy et al. |
| 5,449,947 A | 9/1995 | Chen et al. |
| 5,469,444 A | 11/1995 | Endoh et al. |
| 5,532,962 A | 7/1996 | Auclair et al. |
| 5,570,315 A | 10/1996 | Tanaka et al. |
| 5,581,504 A | 12/1996 | Chang |
| 5,764,572 A | 6/1998 | Hammick |
| 5,774,397 A | 6/1998 | Endoh et al. |
| 5,781,478 A | 7/1998 | Takeuchi et al. |
| 5,812,457 A | 9/1998 | Arase |
| 5,814,853 A | 9/1998 | Chen |
| 5,867,429 A | 2/1999 | Chen et al. |

(Continued)

FOREIGN PATENT DOCUMENTS

EP    1172822 A1    1/2002

(Continued)

OTHER PUBLICATIONS

International Preliminary Report on Patentability dated Dec. 18, 2010, Patent Cooperation Treaty, International Patent Application No. PCT/IL2009/000592 filed Jun. 15, 2009.

(Continued)

*Primary Examiner* — Dang Nguyen

(74) *Attorney, Agent, or Firm* — Vierra Magen Marcus & DeNiro LLP

(57) ABSTRACT

To store, in a memory block whose word lines are written successively in a word line writing order, a plurality of data pages that are ordered by logical page address, the pages are written to the word lines so that every page that is written to any one of the word lines has a higher logical page address than any page that is written to a subsequently written word line, regardless of the sequence in which the pages are received for writing. Alternatively, the pages are written to the word lines so that for every pair of written word lines, the word line of the pair that is earlier in the writing order has written thereto a page having a higher logical page address than at least one page written to the other word line of the pair.

10 Claims, 8 Drawing Sheets

U.S. PATENT DOCUMENTS

| | | | |
|---|---|---|---|
| 5,898,615 | A | 4/1999 | Chida |
| 5,917,766 | A | 6/1999 | Tsuji et al. |
| 5,943,257 | A | 8/1999 | Jeon et al. |
| 6,046,935 | A | 4/2000 | Takeuchi et al. |
| 6,061,280 | A | 5/2000 | Aritome |
| 6,154,391 | A | 11/2000 | Takeuchi et al. |
| 6,175,522 | B1 | 1/2001 | Fang |
| 6,212,101 | B1 | 4/2001 | Lee |
| 6,222,762 | B1 | 4/2001 | Guterman et al. |
| 6,240,016 | B1 | 5/2001 | Haddad et al. |
| 6,259,632 | B1 | 7/2001 | Khouri et al. |
| 6,377,507 | B1 | 4/2002 | Tsao |
| 6,380,033 | B1 | 4/2002 | He et al. |
| 6,411,548 | B1 | 6/2002 | Sakui et al. |
| 6,456,528 | B1 | 9/2002 | Chen |
| 6,522,580 | B2 | 2/2003 | Chen et al. |
| 6,535,423 | B2 | 3/2003 | Trivedi et al. |
| 6,542,407 | B1 | 4/2003 | Chen et al. |
| 6,570,785 | B1 | 5/2003 | Mangan et al. |
| 6,570,790 | B1 | 5/2003 | Harari |
| 6,594,181 | B1 | 7/2003 | Yamada |
| 6,643,188 | B2 | 11/2003 | Tanaka et al. |
| 6,657,891 | B1 | 12/2003 | Shibata et al. |
| 6,707,714 | B2 | 3/2004 | Kawamura |
| 6,717,847 | B2 | 4/2004 | Chen |
| 6,771,536 | B2 | 8/2004 | Li et al. |
| 6,781,877 | B2 | 8/2004 | Cernea et al. |
| 6,785,169 | B1 | 8/2004 | Nemati et al. |
| 6,798,698 | B2 | 9/2004 | Tanaka et al. |
| 6,807,095 | B2 | 10/2004 | Chen et al. |
| 6,870,766 | B2 | 3/2005 | Cho et al. |
| 6,870,768 | B2 | 3/2005 | Cernea et al. |
| 6,888,758 | B1 | 5/2005 | Hemink et al. |
| 6,891,262 | B2 | 5/2005 | Nomoto et al. |
| 6,956,770 | B2 | 10/2005 | Khalid et al. |
| 6,968,421 | B2 | 11/2005 | Conley |
| 7,006,379 | B2 | 2/2006 | Noguchi et al. |
| 7,012,835 | B2 | 3/2006 | Gonzalez et al. |
| 7,020,017 | B2 | 3/2006 | Chen et al. |
| 7,031,214 | B2 | 4/2006 | Tran |
| 7,057,936 | B2 | 6/2006 | Yaegashi et al. |
| 7,085,167 | B2 | 8/2006 | Lee et al. |
| 7,099,194 | B2 | 8/2006 | Tu et al. |
| 7,177,977 | B2 | 2/2007 | Chen et al. |
| 7,233,522 | B2 | 6/2007 | Chen et al. |
| 7,304,894 | B2 | 12/2007 | Joo |
| 7,606,070 | B2 * | 10/2009 | Mokhlesi ................. 365/185.17 |
| 8,144,512 | B2 * | 3/2012 | Huang et al. ............. 365/185.03 |
| 2003/0025147 | A1 | 2/2003 | Nomoto et al. |
| 2003/0053334 | A1 | 3/2003 | Chen |
| 2003/0137888 | A1 | 7/2003 | Chen et al. |
| 2003/0161182 | A1 | 8/2003 | Li et al. |
| 2004/0019737 | A1 | 1/2004 | Kastoriano et al. |
| 2004/0047182 | A1 | 3/2004 | Cernea et al. |
| 2004/0057283 | A1 | 3/2004 | Cernea |
| 2004/0057285 | A1 | 3/2004 | Cernea et al. |
| 2004/0057287 | A1 | 3/2004 | Cernea et al. |
| 2004/0057318 | A1 | 3/2004 | Cernea et al. |
| 2004/0060031 | A1 | 3/2004 | Cernea |
| 2004/0109357 | A1 | 6/2004 | Cernea et al. |
| 2004/0213031 | A1 | 10/2004 | Hosono et al. |
| 2005/0073978 | A1 | 4/2005 | Kim et al. |
| 2005/0162913 | A1 | 7/2005 | Chen |
| 2006/0221683 | A1 | 10/2006 | Chen et al. |
| 2006/0221692 | A1 | 10/2006 | Chen |
| 2006/0221714 | A1 | 10/2006 | Li et al. |
| 2008/0084754 | A1 | 4/2008 | Mokhlesi |
| 2008/0084755 | A1 | 4/2008 | Mokhlesi |
| 2009/0310413 | A1 | 12/2009 | Lasser |

FOREIGN PATENT DOCUMENTS

| | | |
|---|---|---|
| EP | 01271553 A2 | 1/2003 |
| EP | 01329898 A2 | 7/2003 |
| WO | 04/001852 A1 | 12/2003 |
| WO | 2006/107731 A1 | 10/2006 |

OTHER PUBLICATIONS

International Search Report & The Written Opinion of the International Searching Authority dated Sep. 3, 2009, Patent Cooperation Treaty, International Application No. PCT/IL2009/000592 filed on Jun. 15, 2009.

Notice of Allowance and Fee(s) Due dated Jul. 30, 2010, U.S. Appl. No. 12/139,545, filed Jun. 16, 2008.

U.S. Appl. No. 12/139,545, filed Jun. 16, 2008.

* cited by examiner

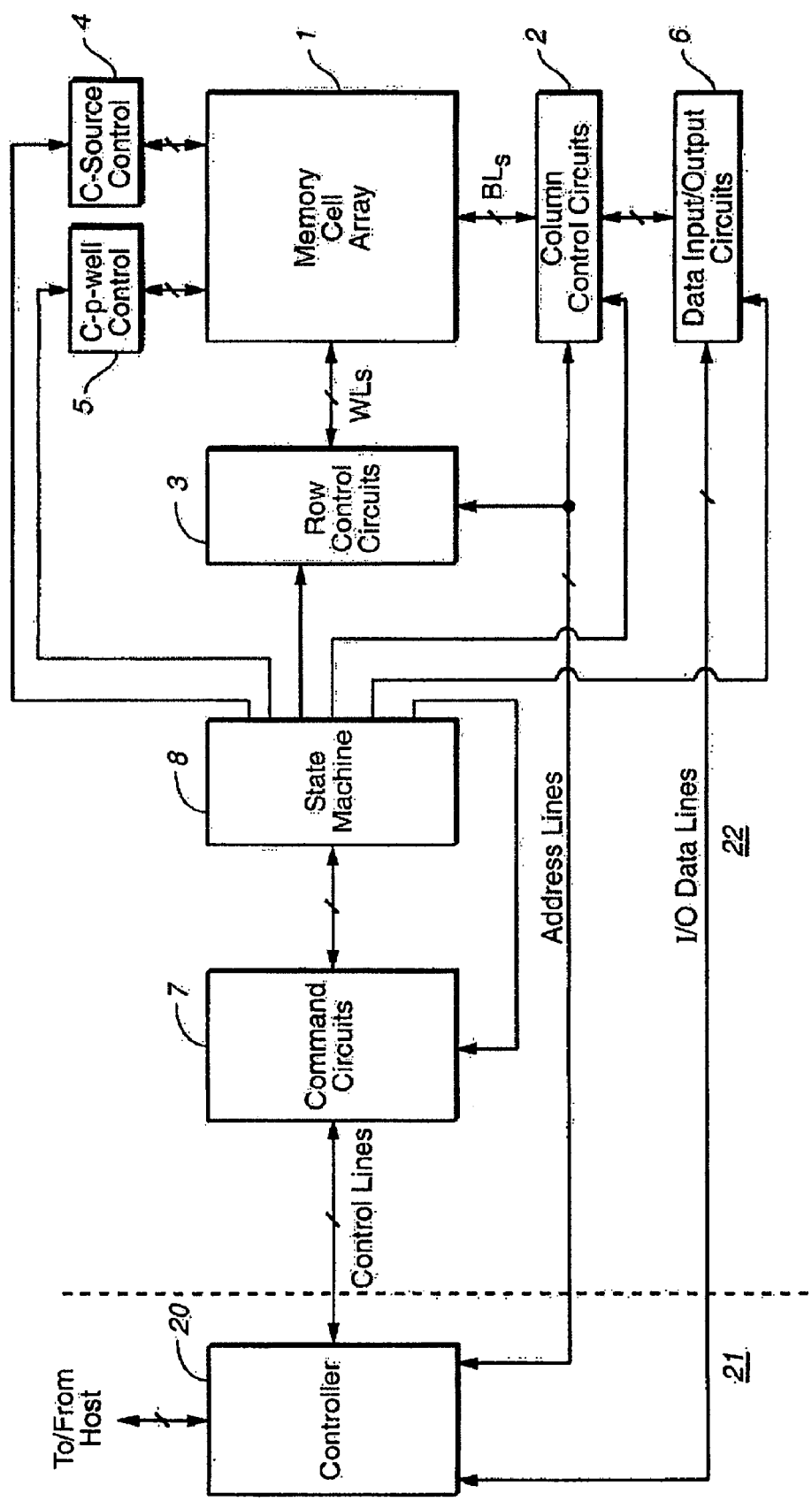
FIG._1

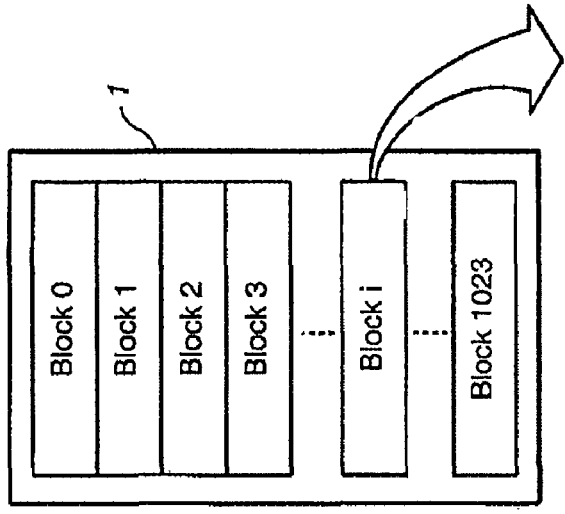
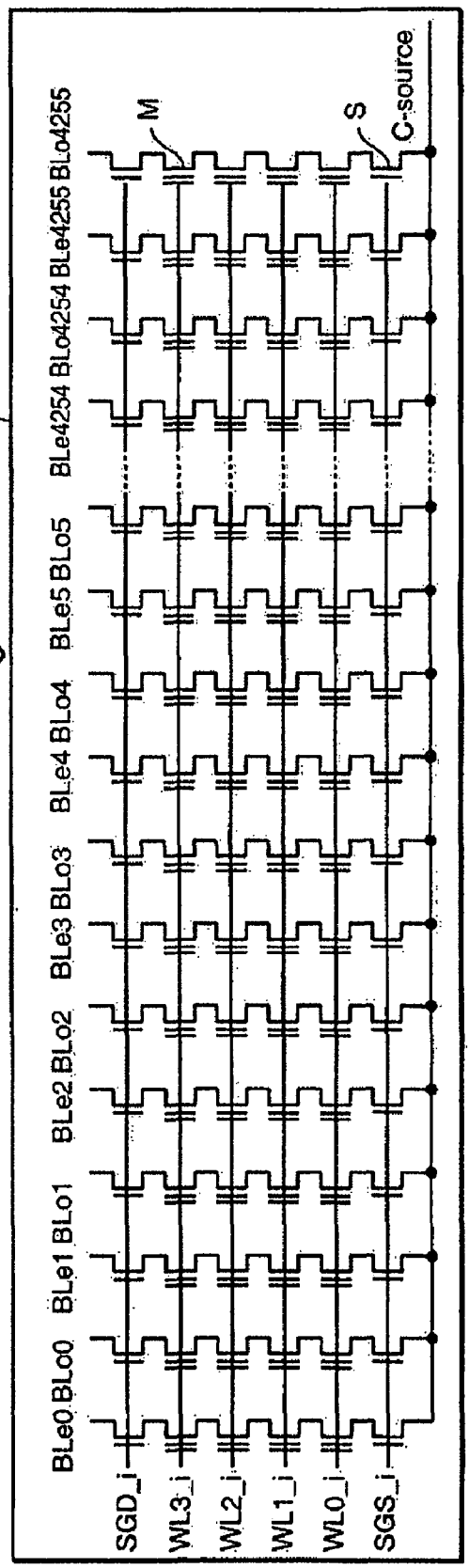
FIG._2

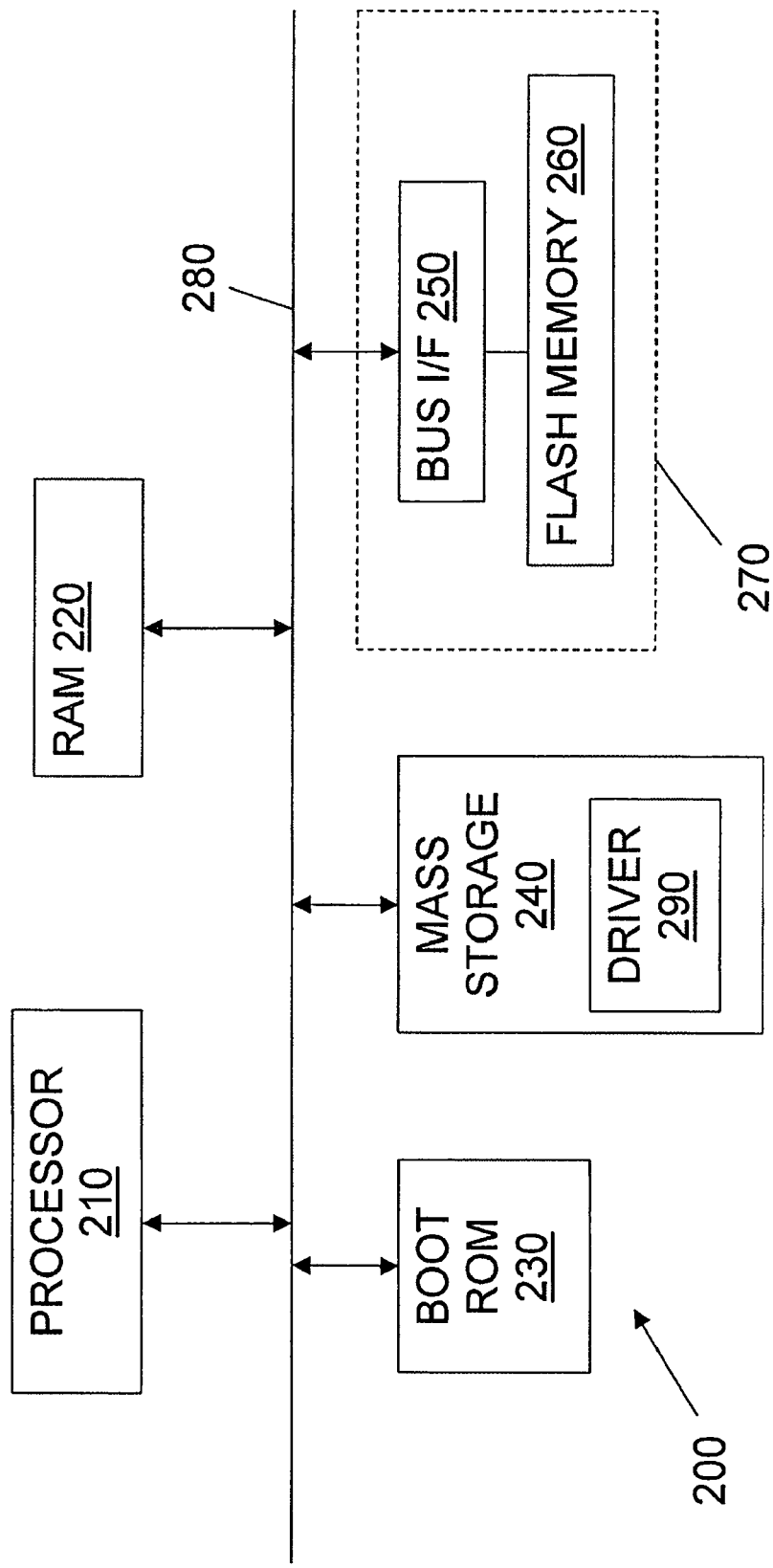

REVERSE ORDER PAGE WRITING IN FLASH MEMORIES

CLAIM OF PRIORITY

The present application is a continuation application of U.S. patent application Ser. No. 12/139,545, entitled "REVERSE ORDER PAGE WRITING IN FLASH MEMORIES," by Menahem Lasser, filed Jun. 16, 2008, issued as U.S. Pat. No. 7,848,144 on Dec. 7, 2010, incorporated by reference herein in its entirety.

FIELD AND BACKGROUND OF THE INVENTION

Described herein are methods of writing and reading flash memories, as well as flash memory devices and systems that are so read and written.

Flash memories such as NAND flash memories are structured as rectangular arrays of memory cells. The cells are arranged in orthogonal bit lines and word lines. One or more bits of data are written to each cell by injecting sufficient electrical charge into a floating gate of the cell to place the cell's threshold voltage within a range of threshold voltages that represents the value of that bit or of those bits. A flash memory cell is read by comparing its threshold voltage to reference voltages that mark the boundaries between threshold voltage ranges. In the case of a NAND flash memory, the cells are written and read one full word line at a time. The word lines are grouped further into blocks, such that cells are erased an entire block at a time.

The word lines of a given block are written sequentially. After the first word line of a block is written, writing the subsequent word lines of the block may disturb the previously written word lines, because injecting electrical charge into the floating gates of the cells of one word line may also affect electrical fields in the cells of neighboring word lines, thereby increasing the threshold voltages of the cells of a nearby, previously written word line, possibly to the point of changing the bit values that are represented by the threshold voltages of the previously written nearby word line. This coupling between successively written flash memory cells is called the Yupin effect.

Two general methods are known for mitigating the Yupin effect. The first method is: whenever reading a word line other than the last written word line of a block, first read also one or more word lines of the block that were written after the target word line was written, adjust the reference voltages that are to be used to read the target word line according to the threshold voltages of the cells of the other word lines, as read, and use the adjusted reference voltages to read the target word line. The disadvantage of this method is that it slows down the reading of the target word line by requiring that two or more word lines be read in order to correctly read the target word line. The second method is to write the word lines of a block, except for the last word line, by injecting somewhat less than enough charge into the floating gates of the cells to raise the cells' threshold voltages to the desired level. Then, for each target word line, after the other word lines that could disturb the writing of the target word line have been so written, more electrical charge is injected into the cells of the target word line whose threshold voltages have not been raised to their desired values by the disturbances associated with the writing of the other word lines, to raise these threshold voltages to their desired values. The disadvantage of this method is that it slows down the writing of the word lines. Essentially, all but the last word line of the block must be written twice.

SUMMARY OF THE INVENTION

There is provided herein a method of storing data that are organized in a plurality of pages that are ordered according to a logical page address order, including: (a) providing a memory that includes a block, the block including a plurality of word lines that are written successively in a word line writing order; (b) receiving the pages of data; and (c) writing the pages to the word lines, with the logical page address order of successively written pages being such that every page that is written to any one of the word lines has a higher logical page address than any page that is written to any subsequently written word line, regardless of a sequence in which the pages are received.

There also is provided herein a method of storing data that are organized in a plurality of pages that are ordered according to a logical page address order, including: (a) receiving the pages of data; and (b) sending the pages of data to a memory that includes a block, the block including a plurality of word lines that are written successively in a word line writing order, the pages being sent in a sending order such that every page that is written to any one of the word lines has a higher logical page address than any page that is written to any subsequently written word line, regardless of a sequence in which the pages are received.

There also is provided herein a memory device controller operative: (a) to receive a plurality of pages to store in a memory block that includes a plurality of word lines that are written successively in a word line writing order, the pages being ordered according to a logical page address order; and (b) to send the pages to the memory block in a sending order such that every page that is written to any one of the word lines has a higher logical page address than any page that is written to any subsequently written word line, regardless of a sequence in which the pages are received.

There also is provided herein a system including: (a) a nonvolatile memory wherein is stored a driver for a memory device that includes a memory block and writing circuitry, the memory block including a plurality of word lines, the writing circuitry being operative to write the word lines successively in a word line writing order, the driver including: (i) code for receiving a plurality of pages of data to store in the memory device, the pages being ordered according to a logical page address order, and (ii) code for sending the pages to the writing circuitry in a sending order such that every page that is written to any one of the word lines has a higher logical page address than any page that is written to any subsequently written word line, regardless of a sequence in which the pages are received; and (b) a processor for executing the code.

There also is provided herein a computer-readable storage medium having computer-readable code embedded thereon, the computer-readable code being driver code for a memory device that includes a memory block having a plurality of word lines, writing circuitry for writing the word lines successively in a word line writing order and reading circuitry for reading from a selected word line, the computer-readable code including: (a) program code for receiving a plurality of pages of data to store in the memory device, the pages being ordered according to a logical page address order; and (b) program code for sending the pages to the writing circuitry in a sending order such that every page that is written to any one of the word lines has a higher logical page address than any page that is written to any subsequently written word line, regardless of a sequence in which the pages are received.

There also is provided herein a method of storing data that are organized in a plurality of pages that are ordered according to a logical page address order, including: (a) providing a memory that includes a block, the block including a plurality of word lines that are written in a word line writing order; (b) receiving the pages of data; and (c) writing the pages to the word lines, so that for any pair of written word lines, the word line of the pair that is earlier in the word line writing order has written thereto a page having a higher logical page address than at least one page written to the word line of the pair that is later in the word line writing order, regardless of a sequence in which the pages are received.

There also is provided herein a method of storing data that are organized in a plurality of pages that are ordered according to a logical page address order, including: (a) receiving the pages of data; and (b) sending the pages of data to a memory that includes a block, the block including a plurality of word lines that are written in a word line writing order, the pages being sent in a sending order such that as a result of the writing of the pages to the word lines, for any pair of written word lines, the word line of the pair that is earlier in the word line writing order has written thereto a page having a higher logical page address than at least one page written to the word line of the pair that is later in the word line writing order, regardless of a sequence in which the pages are received.

There also is provided herein a memory device controller operative: (a) to receive a plurality of pages to store in a memory that includes a memory block, the memory block including a plurality of word lines that are written in a word line writing order, the pages being ordered according to a logical page address order; and (b) to send the pages to the memory in a sending order such that as a result of the writing of the pages to the word lines, for any pair of written word lines, the word line of the pair that is earlier in the word line writing order has written thereto a page having a higher logical page address than at least one page written to the word line of the pair that is later in the word line writing order, regardless of a sequence in which the pages are received.

There also is provided herein a system including: (a) a nonvolatile memory wherein is stored a driver for a memory device that includes a memory block and writing circuitry, the memory block including a plurality of word lines, the writing circuitry being operative to write the word lines in a word line writing order, the driver including: (i) code for receiving a plurality of pages of data to store in the memory device, the pages being ordered according to a logical page address order, and (ii) code for sending the pages to the writing circuitry in a sending order such that as a result of the writing of the pages to the word lines, for any pair of written word lines, the word line of the pair that is earlier in the word line writing order has written thereto a page having a higher logical page address than at least one page written to the word line of the pair that is later in the word line writing order, regardless of a sequence in which the pages are received; and (b) a processor for executing the code.

There also is provided herein a computer-readable storage medium having computer-readable code embedded thereon, the computer-readable code being driver code for a memory device that includes a memory block having a plurality of word lines, writing circuitry for writing the word lines successively in a word line writing order and reading circuitry for reading from a selected word line, the computer-readable code including: (a) program code for receiving a plurality of pages of data to store in the memory device, the pages being ordered according to a logical page address order; and (b) program code for sending the pages to the writing circuitry in a sending order such that as a result of the writing of the pages to the word lines, for any pair of written word lines, the word line of the pair that is earlier in the word line writing order has written thereto a page having a higher logical page address than at least one page written to the word line of the pair that is later in the word line writing order, regardless of a sequence in which the pages are received.

Presented herein are methods and associated devices for storing data that are organized in a plurality of pages. The pages are ordered according to a logical page address order: each page has associated with it a respective unique number that serves as a logical page address for that page, such that the page with the lowest page address is the first page in the order, the page with the next-to-lowest page address is the second page in the order, etc. Note that the ordering of the pages according to logical page address has nothing to do with the order in which the pages are received for storage.

In a first method of storing the pages of data, a memory is provided that includes a block. The block includes a plurality of word lines that are written successively in a word line writing order. The pages of data are received. The pages are written to the word lines, with the logical page address order of successively written pages being such that every page that is written to any one of the word lines has a higher logical page address than any page that is written to any subsequently written word line, regardless of the sequence in which the pages were received. Note that this limitation on writing order, and similar limitations in the other methods presented herein, apply only within the block, and not e.g. between or among blocks in the case of a memory that includes more than one block.

In some embodiments of the first method, two or more of the word lines are read sequentially according to the logical page address order of the pages stored therein, so that the word lines are read opposite to the word line writing order. After the first of the two or more word lines has been read, each word line, that is read subsequently, is read in accordance with the data read from the word line that was read immediately before that word line. In some of these embodiments, the word line that was read immediately before that "subsequently read" word line is the immediate successor of that "subsequently read" word line according to the word line writing order.

In some embodiments of the first method, the data pages are cached prior to being written to the word lines. In some of these embodiments, a sufficient number of data pages are cached to fill all the word lines of the block.

In a second method of storing the pages of data, the pages are received and then are sent to a memory that includes a block. The block includes a plurality of word lines that are written successively in a word line writing order. The pages are sent to the memory in a sending order such that every page that is written to any one of the word lines has a higher logical page address than any page that is written to any subsequently written word line, regardless of the sequence in which the pages were received.

A first memory device controller receives the pages for storing in a memory block that includes a plurality of word lines that are written successively in a word line writing order. The controller sends the pages to the memory block in a sending order such that every page that is written to any one of the word lines has a higher logical page address than any page that is written to any subsequently written word line, regardless of the sequence in which the pages were received.

A first memory device includes the first memory device controller, the memory block and writing circuitry for writing the word lines successively in the word line writing order.

Some embodiments of the first memory device also include reading circuitry for reading from a selected word line. Some of these embodiments also include a buffer in which the reading circuitry stores the data of the selected word line and also reading correction circuitry for adjusting the reading of a subsequently read word line in accordance with the data stored in the buffer. Usually, the subsequently selected word line is the immediate predecessor, according to the word line writing order, of the word line from which the data in the buffer were read.

In some embodiments of the first memory device that include the reading circuitry, the controller also selects two or more of the word lines to be read successively by the reading circuitry. The controller receives the data that are read by the reading circuitry. Subsequent to the reading from the first selected word line, for each subsequently selected word line, the controller reads the data of that subsequently selected word line in accordance with the data read from the selected word line that was read immediately prior to the reading from that subsequently selected word line. In some of these embodiments, the word line that was read immediately before that "subsequently read" word line is the immediate successor of that "subsequently read" word line according to the word line writing order.

Some embodiments of the first memory device also include a cache for storing the data pages prior to writing the data pages to the word lines.

In some embodiments of the first memory device controller, the controller also selects two or more of the word lines to be read successively. The controller receives the data thus read. Subsequent to the reading from the first selected word line, for each subsequently selected word line, the controller reads the data of that subsequently selected word line in accordance with the data read from the selected word line that was read immediately prior to the reading from that subsequently selected word line. In some of these embodiments, the word line that was read immediately before that "subsequently read" word line is the immediate successor of that "subsequently read" word line according to the word line writing order.

A first system includes a nonvolatile memory and a processor. In the nonvolatile memory there is stored a driver for a memory device that includes a memory block and writing circuitry. The memory block includes a plurality of word lines. The writing circuitry writes the word lines successively in a word line writing order. The driver includes code for receiving the pages of data to store in the memory device. The driver also includes code for sending the pages to the writing circuitry in a sending order such that every page that is written to any one of the word lines has a higher logical page address than any page that is written to any subsequently written word line, regardless of the sequence in which the pages were received. The processor executes the code.

Normally, the first system also includes the memory device. In some such embodiments of the first system, the memory device also includes reading circuitry for reading from a selected word line. The driver then also includes code for selecting two or more of the word lines to be read by the reading circuitry, code for receiving the data that are read by the reading circuitry, and code for, subsequent to the reading of the first selected word line, for each subsequently selected word line, reading the data of that subsequently selected word line in accordance with the data that were read from the selected word line that was read immediately prior to the reading of that "subsequently selected" word line. In some of these embodiments, the word line that was read immediately before that "subsequently selected" word line is the immediate successor of that "subsequently selected" word line according to the word line writing order.

A first computer-readable storage medium has computer-readable code embedded thereon. The computer-readable code is the driver code of the first memory device.

In a third method of storing the pages of data, a memory is provided that includes a block. The block includes a plurality of word lines that are written in a word line writing order. The pages of data are received. The pages are written to the word lines, so that for any pair of written word lines, the word line of the pair that is earlier in the writing order has written thereto a page having a higher logical page address than at least one page that is written to the word line of the pair that is later in the word line writing order, regardless of the sequence in which the pages were received.

In a fourth method of storing the pages of data, the pages are received and then are sent to a memory that includes a block. The block includes a plurality of word lines that are written successively in a word line writing order. The pages are sent to the memory in a sending order such that as a result of the writing of the pages to the word lines, for any pair of written word lines, the word line of the pair that is earlier in the word line writing order has written thereto a page having a higher logical page address than at least one page that is written to the word line of the pair that is later in the word line writing order, regardless of the sequence in which the pages were received.

A second memory device controller receives the pages for storing in a memory block that includes a plurality of word lines that are written successively in a word line writing order. The controller sends the pages to the memory block in a sending order such that as a result of the writing of the pages to the word lines, for any pair of written word lines, the word line of the pair that is earlier in the word line writing order has written thereto a page having a higher logical page address than at least one page that is written to the word line of the pair that is later in the word line writing order, regardless of the sequence in which the pages were received.

A second system includes a nonvolatile memory and a processor. In the nonvolatile memory there is stored a driver for a memory device that includes a memory block and writing circuitry. The memory block includes a plurality of word lines. The writing circuitry writes the word lines successively in a word line writing order. The driver includes code for receiving the pages of data to store in the memory device. The driver also includes code for sending the pages to the writing circuitry in a sending order such that such that as a result of the writing of the pages to the word lines, for any pair of written word lines, the word line of the pair that is earlier in the word line writing order has written thereto a page having a higher logical page address than at least one page that is written to the word line of the pair that is later in the word line writing order, regardless of the sequence in which the pages were received. The processor executes the code.

A second computer-readable storage medium has computer-readable code embedded thereon. The computer-readable code is the driver code of the second memory device.

BRIEF DESCRIPTION OF THE DRAWINGS

The invention is herein described, by way of example only, with reference to the accompanying drawings, wherein:

FIG. 1 is a block diagram of a flash memory device;

FIG. 2 illustrates an exemplary structure of the memory cell array of the flash memory device of FIG. 1;

FIG. 7 is a partial high-level block diagram of a data storage system.

DESCRIPTION OF THE PREFERRED EMBODIMENTS

Figure 3A:
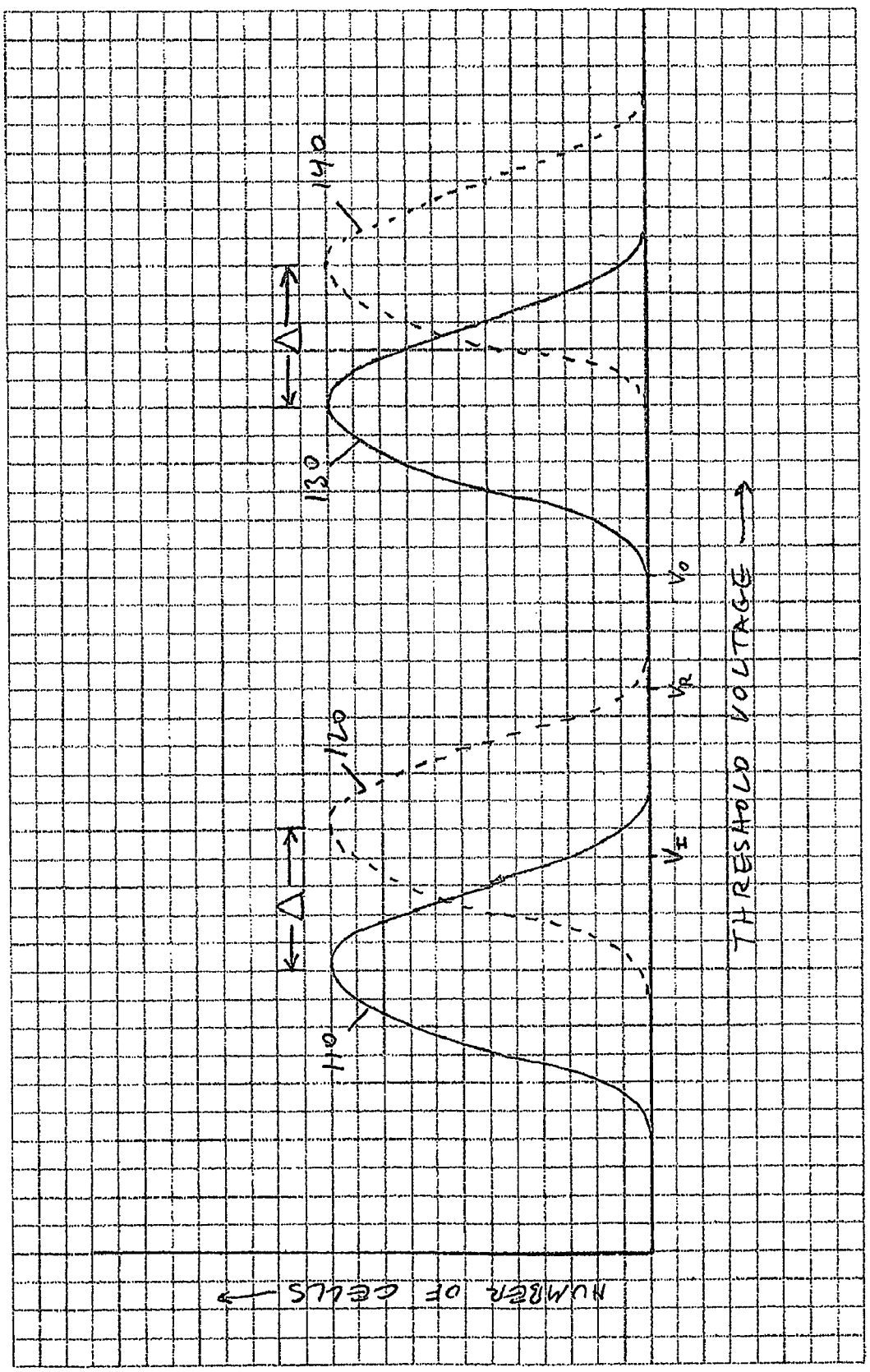
FIGS. 3A and 3B illustrate the Yupin effect.

The principles and operation of a flash memory according to the present invention may be better understood with reference to the drawings and the accompanying description.

Referring now to the drawings, FIG. 1 is a block diagram of a flash memory device. A memory cell array 1 including a plurality of memory cells M arranged in a matrix is controlled by a column control circuit 2, a row control circuit 3, a c-source control circuit 4 and a c-p-well control circuit 5. Column control circuit 2 is connected to bit lines (BL) of memory cell array 1 for reading data stored in the memory cells (M), for determining a state of the memory cells (M) during a writing operation, and for controlling potential levels of the bit lines (BL) to promote the writing or to inhibit the writing. Row control circuit 3 is connected to word lines (WL) to select one of the word lines (WL), to apply read voltages, to apply writing voltages combined with the bit line potential levels controlled by column control circuit 2, and to apply an erase voltage coupled with a voltage of a p-type region on which the memory cells (M) are formed. C-source control circuit 4 controls a common source line connected to the memory cells (M). C-p-well control circuit 5 controls the c-p-well voltage.

The data stored in the memory cells (M) are read out by column control circuit 2 and are output to external I/O lines via an I/O line and a data input/output buffer 6. Program data to be stored in the memory cells are input to data input/output buffer 6 via the external I/O lines, and are transferred to column control circuit 2. The external I/O lines are connected to a controller 20.

Command data for controlling the flash memory device are input to a command interface connected to external control lines which are connected with controller 20. The command data inform the flash memory of what operation is requested. The input command is transferred to a state machine 8 that controls column control circuit 2, row control circuit 3, c-source control circuit 4, c-p-well control circuit 5 and data input/output buffer 6. State machine 8 can output a status data of the flash memory such as READY/BUSY or PASS/FAIL.

Controller 20 is connected or connectable with a host system such as a personal computer, a digital camera, a personal digital assistant. It is the host which initiates commands, such as to store or read data to or from the memory array 1, and provides or receives such data, respectively. Controller 20 converts such commands into command signals that can be interpreted and executed by command circuits 7. Controller 20 also typically contains buffer memory for the user data being written to or read from the memory array. A typical memory device includes one integrated circuit chip 21 that includes controller 20, and one or more integrated circuit chips 22 that each contain a memory array and associated control, input/output and state machine circuits. The trend, of course, is to integrate the memory array and controller circuits of such a device together on one or more integrated circuit chips. The memory device may be embedded as part of the host system, or may be included in a memory card that is removably insertable into a mating socket of host systems. Such a card may include the entire memory device, or the controller and memory array, with associated peripheral circuits, may be provided in separate cards.

FIG. 2 illustrates an examplary structure of memory cell array 1. A NAND flash EEPROM is described as an example. The memory cells (M) are partitioned into 1,024 blocks, in a specific example. The data stored in each block are simultaneously erased. The block is thus the minimum unit of a number of cells that are simultaneously erasable. In each block, in this example, there are 8,512 columns that are divided into even columns and odd columns. The bit lines are also divided into even bit lines (BLe) and odd bit lines (BLo). Four memory cells connected to the word lines (WL0 to WL3) at each gate electrode are connected in series to form a NAND cell unit. One terminal of the NAND cell unit is connected to corresponding bit line (BL) via a first select transistor (S) which gate electrode is coupled to a first select gate line (SGD), and another terminal is connected to the c-source via a second select transistor (S) which gate electrode is coupled to a second select gate line (SGS). Although four floating gate transistors are shown to be included in each cell unit, for simplicity, in practice a higher number of transistors, such as 8, 16 or even 32, are used.

During a user data read or writing operation, 4,256 cells (M) are simultaneously selected, in this example. The cells (M) selected have the same word line (WL), for example WL2, and the same kind of bit line (BL), for example the even bit lines BLe0 to BLe4255. Therefore, 532 bytes (8 bits per byte) of data can be read or written simultaneously, one bit per cell. These 532 bytes of data simultaneously read or written form a logical page. Therefore, one block can store at least eight pages. In the case of multi-level cells, such that each memory cell stores two bits of data, each block stores 16 pages.

FIG. 3A illustrates the Yupin effect for cells that store single bits. The threshold voltages of cells in their erased state, that conventionally represents a "1" bit, are distributed statistically according to a distribution 110. A "0" bit is written to a cell by injecting enough electrical charge into the cell's floating gate to raise the cell's threshold voltage above a value $V_0$. Because the injection process is stochastic, the threshold voltages of cells that store "0" bits also are distributed statistically, according to a distribution 130. To read a cell, the threshold voltage of the cell is compared to a reference voltage $V_R$. If the threshold voltage of the cell exceeds $V_R$, the cell is deemed to store a "0" bit. Otherwise, the cell is deemed to store a "1" bit.

Now suppose that the first word line, WL0, of a block of FIG. 2 has been written. Writing cells of the second word line, WL1, also increases the threshold voltages of some of the cells of word line WL0. The main disturbance of a cell of word line WL0 is by the cell of word line WL1 that shares the same bit line BL: if the cell of word line WL1 is not written then the threshold voltage of the cell of word line WL0 on the same bit line BL is not increased, but writing a cell of word line WL1 tends to also increase the threshold voltage of the cell of word line WL0 that shares the same bit line BL. The threshold voltage distributions of the cells of word line WL0 that share bit lines BL with written cells of word line WL1 are shifted upwards by an amount Δ, to shifted threshold voltage distributions 120 and 140. The cells of word line WL0 that were written with "0" bits still have threshold voltages above $V_0$ and so still are read correctly as storing "0" bits; but a small fraction of the unwritten cells of word line WL0, that are supposed to store "1" bits, have had their threshold voltages shifted above $V_R$ and so are read incorrectly as storing "0" bits. It will be appreciated that in the case of cells that store more than one bit per cell, so that the relevant threshold voltage distributions are narrower and more crowded together than in the single-bit-per-cell illustrated in FIG. 3A, even more reading errors are induced by the Yupin effect.

Figure 3B:
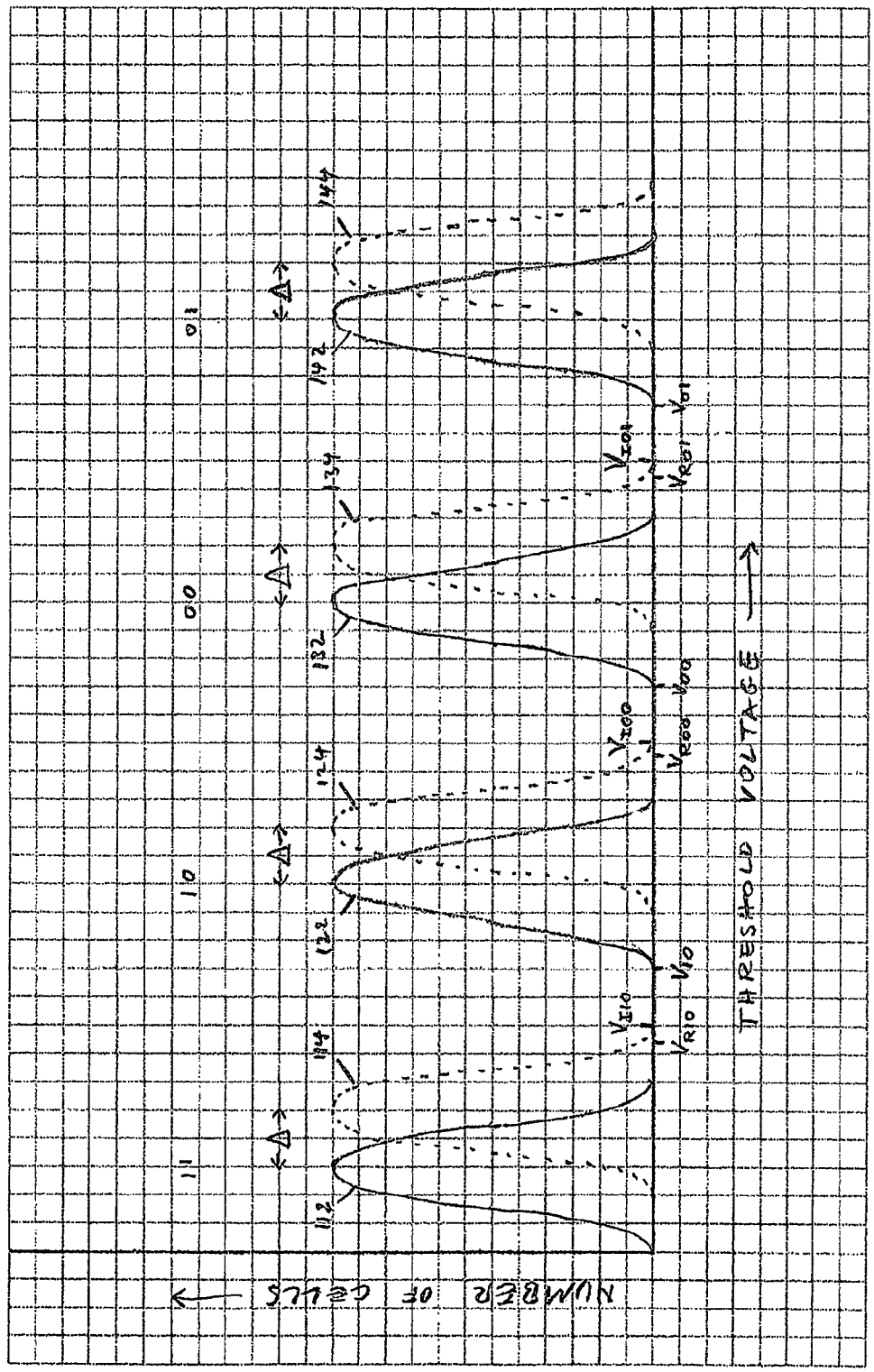

FIG. 3B illustrates the Yupin effect for cells that store two bits each. The threshold voltages of cells in their erased state, that conventionally represents the bit pair "11", are distributed statistically according to a distribution 112. A different bit pair ("10", "00" or "01") is written to a cell by injecting enough electrical charge into the cell's floating gate to raise the cell's threshold voltage above a corresponding threshold voltage value: $V_{10}$ for the bit pair "10", $V_{00}$ for the bit pair "00" and $V_{01}$ for the bit pair "01". In the example presented in FIG. 3B, $V_{10}<V_{00}<V_{01}$ but other conventions also are used. Because the injection process is stochastic, the threshold voltages of the cells that store bit pairs other than "11" also are distributed statistically: the threshold voltages of the cells that store the bit pair "10" are distributed according to a distribution 122, the threshold voltages of the cells that store the bit pair "00" are distributed according to a distribution 132 and the threshold voltages of the cells that store the bit pair "01" are distributed according to a distribution 142. To read a cell, the threshold voltage of the cell is compared to 10 reference voltages $V_{R10}$, $V_{R00}$ and $V_{R01}$. If the threshold voltage of the cell is above $V_{R01}$ the cell is deemed to store the bit pair "01". If the threshold voltage of the cell is in the threshold voltage interval ($V_{R00}$, $V_{R01}$] the cell is deemed to store the bit pair "00". If the threshold voltage of the cell is in the threshold voltage interval ($V_{R10}$,$V_{R00}$] the cell is deemed to store the bit pair "10". Otherwise the cell is deemed to store the bit pair "11".

Now suppose that the first word line, WL0, of a block of FIG. 2 has been written. Writing cells of the second word line, WL1, also increases the threshold voltages of some of the cells of word line WL0. The main disturbance of a cell of word line WL0 is by the cell of word line WL1 that shares the same bit line BL: if the cell of word line WL1 is not written then the threshold voltage of the cell of word line WL0 on the same bit line BL is not increased, but writing a cell of word line WL1 tends to also increase the threshold voltage of the cell of word line WL0 that shares the same bit line BL. The threshold voltage distributions of the cells of word line WL0 that share bit lines BL with written cells of word line WL1 are shifted upwards by an amount Δ, to shifted threshold voltage distributions 114, 124, 134 and 144. The cells of word line WL0 that were written with the bit pair "01" still have threshold voltages above $V_{R01}$ and so still are read correctly as storing "01" bits; but a small fraction of the cells of word line WL0, that are supposed to store the bit pairs "11", "10" and "00", have had their threshold voltages shifted above $V_{R10}$, $V_{R00}$ and $V_{R01}$, respectively, and so are read incorrectly. For simplicity of illustration, all four threshold voltage distributions are illustrated as being shifted by the same shift Δ. In practice, there can be as many as sixteen different Δ's, corresponding to the sixteen different bit pair combinations of adjacent cells on the same bit line.

As noted above, there are two known general methods of mitigating the Yupin effect.

In the first method, before word line WL0 is read, word line WL1 is read. If the threshold voltage of a cell of word line WL1 is greater than $V_0$ then the appropriate value of Δ is added to the relevant reference voltage to provide an adjusted reference voltage for reading the cell of word line WL0 that shares a bit line BL with that cell of word line WL1.

In the second method, which is relevant only to the multiple-bits-per-cell case, as illustrated in FIG. 3B, when word lines WL0 and WL1 are written, the threshold voltages of the cells of word line WL0 that are to store bit pairs other than "11" are raised only above corresponding intermediate levels: $V_{110}$ rather than $V_{10}$, $V_{100}$ rather than $V_{00}$, and $V_{101}$ rather than $V_{01}$. Then the threshold voltages of the cells of word line WL1 that are to store bit pairs other than "11" are raised only above $V_{110}$, $V_{100}$ or $V_{101}$ rather than above $V_{10}$, $V_{00}$ or $V_{11}$. Then the threshold voltages of the cells of word line WL0 that are to store bit pairs other than "11" and that have not yet been raised above the desired final threshold voltage value, $V_{10}$, $V_{00}$ or $V_{01}$, by the Yupin effect in the second writing step are so raised. Similarly, the completion of the writing of the cells of word line WL1 that are to store bit pairs other than "11" is deferred until after the threshold voltages of the cells of word line WL2 that are to store bit pairs other than "11" are raised above the appropriate intermediate threshold voltage values. This method mitigates the influence of the Yupin effect on the cells that are to store bit pairs other than "11" but does not mitigate the influence of the Yupin effect on the cells that are to remain in their erased state to represent the bit pair "11".

Also as noted above, the problem with the first method is that in order to read a word line correctly, (at least) two word lines must be read, which (at least) doubles the time needed to read a word line. However, in the typical case of a host of a flash memory writing pages to a block in sequential logical order and then reading the pages in the same sequential logical order, the Yupin effect can be mitigated by writing the corresponding word lines in the opposite order: the page with the lowest logical address (the first page in the block, as seen by the host) is stored in the highest numbered (last to be written) word line, and the page with the highest logical address (the last page of the block, as seen by the host) is stored in the lowest numbered (first to be written) word line. When the host sends successive pages to be stored in a block (going from low logical page addresses to higher logical page addresses) the pages end up in a reversed physical order in the physical block: the higher the logical page number the lower the corresponding word line number.

For simplicity, in the following examples, it is assumed that one page is written per word line. The extension to the case of two pages per word line, as illustrated in FIG. 2, or to more than two pages per word line, is straightforward.

The following is the sequence of events when a host requests all the pages of a block, sequentially from first to last. The improvement in efficiency over the known methods of correcting for Yupin effects is evident.

1. The host requests page 0.
2. Page 0 data are read from the last word line of the block. The last word line does not suffer from noticeable coupling effects, because no other word line was written after the last word line was written. Therefore, no correction need be applied.
3. Page 0 data are sent to the host and also are kept for future use.
4. The host requests page 1.
5. Page 1 data are read from the next-to-last word line of the block using corrections according to the data of page 0.
6. Page 1 data are sent to the host and also are kept for future use. Page 0 data may be discarded.
7. The host requests page 2.
8. Page 2 data are read from the third-from-last word line of the block using corrections according to the data of page 1.
9. Page 2 data are sent to the host and also are kept for future use. Page 1 data may be discarded.
Etc.

The validity of the above scheme is conditional upon writing the pages from last to first, according to the host's logical ordering of the pages. As is well known, multi-level flash devices mandate that the writing order be from first (lowest address) word line to last word line. Therefore, this method of mitigating the Yupin effect does not have general applicability, because when a flash device receives the first page to be stored in a block, the device cannot store the page in the last physical word line of the block, as required for this method to be applicable.

Figure 4:
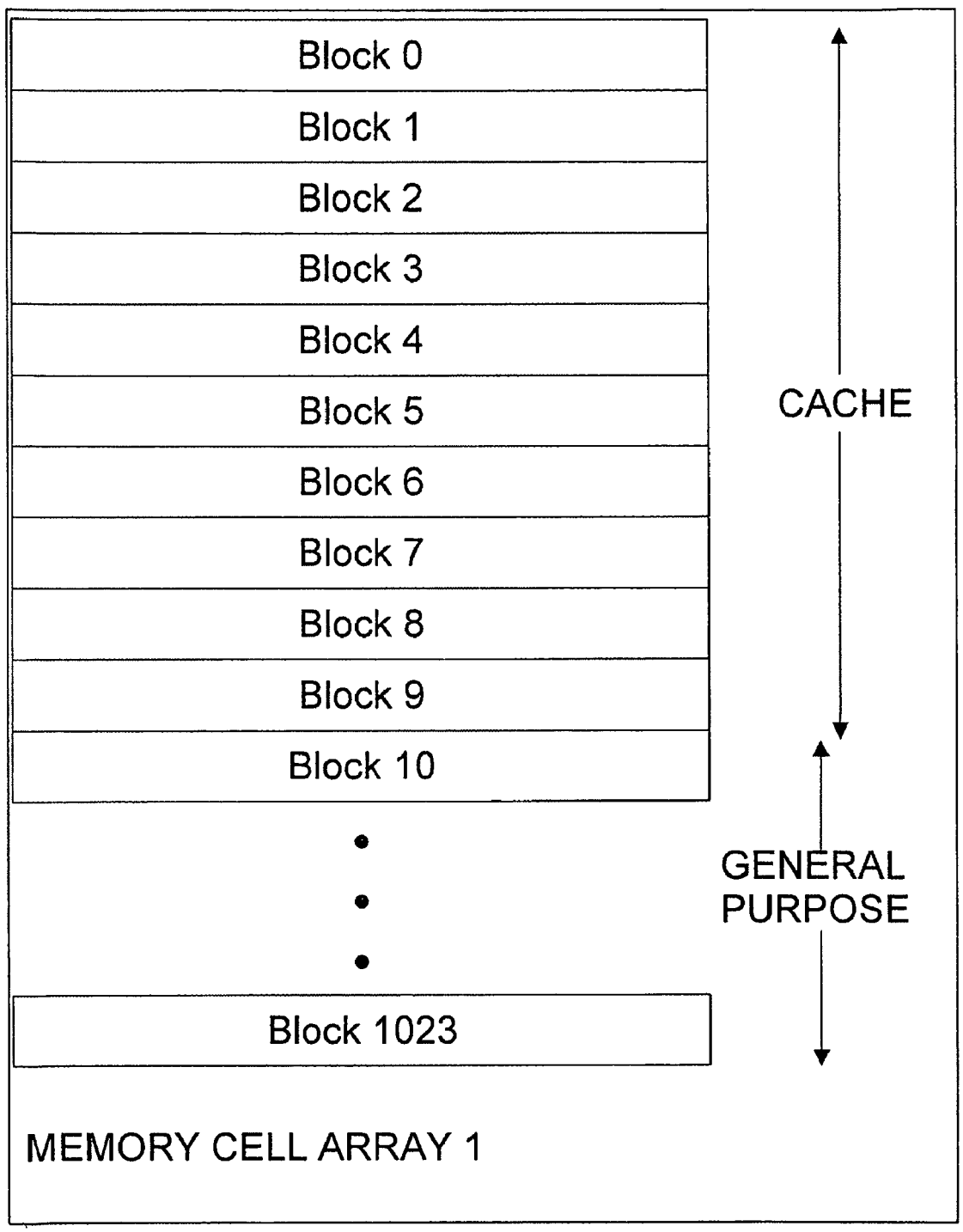
FIG. 4 shows one way of partitioning the blocks of the memory cell array of the flash memory device of FIG. 1 between a cache and general-purpose blocks.

Nevertheless, this method is fully applicable to flash storage systems that use a self-caching scheme. In such systems the incoming data first are stored in a temporary buffer, and are transferred at a later stage to their target location. FIG. 4 shows one way of grouping the blocks of memory cell array 1 to use some of the blocks as such a temporary buffer. In FIG. 4, blocks 0 through 9 are cache blocks where incoming data are stored temporarily and blocks 10 through 1023 are general-purpose blocks for long-term storage. Typically, data are stored one bit per cell in cache blocks 0 through 9 because writing one bit per cell is much faster than writing several bits per cell. Then, in background, the data are transferred to long-term storage blocks for more compact storage. Also, typically, the role of cache blocks is not static but is moved dynamically among the blocks, for the sake of wear leveling. The transferring of the data typically is done when the full contents of the target block already are known: the contents are located either in the buffer or in a different permanent location within the device (for pages that were not overwritten since the last update). Therefore, the data movement process can fill the target block from lowest word line to highest word line, while at the same time making sure that the data end up according to the reversed scheme that is essential for the new method to be applicable.

Referring again to FIG. 1, the new method is implemented using controller 20 and optionally also command circuits 7. The following are two exemplary alternative architectures.

Figure 5:
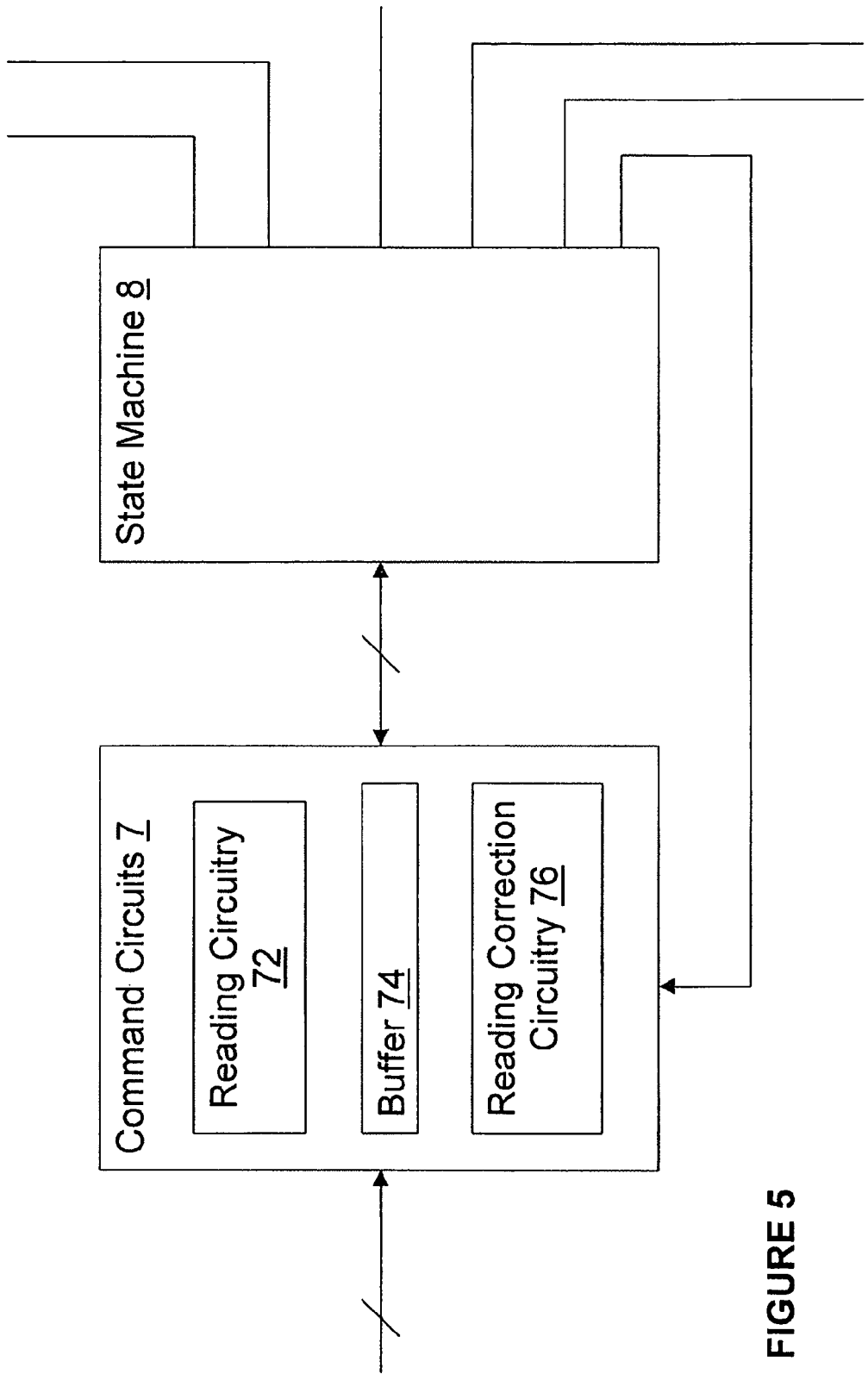
FIGS. 5 and 6 are enlarged views of a portion of FIG. 1.

A. The new method is implemented cooperatively by controller 20 and command circuits 7. Whenever command circuits 7 receive a read request, command circuits 7 keep the retrieved data in an internal temporary buffer. When the next page is requested, if the next page is stored in the word line that is one word line lower than the word line corresponding to the data in the internal buffer (i.e. in the word line that was written immediately before the word line corresponding to the data in the internal buffer), command circuits 7 adjust reference threshold voltage values according to the kept data, in the way that these reference threshold voltage values are adjusted in the first known method. If the next requested page is not stored in the word line that is one lower than the word line corresponding to the data in the internal buffer, controller 20 reverts to the first known method. In order for this embodiment to be useful, controller 20 must cooperate and issue read commands that (when the host reads sequentially) access the word lines from highest address to lowest address, which is easily done in a self-caching system. Note that the circuitry on chip 22 need not be modified with respect to writing: the inversion of writing order is done by controller 20 and the circuitry on chip 22 just writes data to word lines of a block from lowest word line to highest word line. FIG. 5 is an enlarged view of part of FIG. 1, showing that command circuits 7 include reading circuitry 72 for reading a selected word line, a buffer 74 for temporary storage of the data read by reading circuitry 72, and reading correction circuitry 76 for adjusting the reference threshold voltage values used by reading circuitry 72 in accordance with data stored in buffer 74.

B. The new method is implemented entirely in controller 20 and the circuitry on chip 22 are not modified with respect to either writing or reading. Both the inverted writing and the correction upon reading are performed by controller 20. Writing is the same as in embodiment "A". For reading, controller 20 sends reading commands to read the pages in the reversed order. The data read from the cells are sent to controller 20 and no copy is kept in circuit chip 22. Controller 20 applies error correction to the data and sends the data to the host. Controller 20 keeps the data in a temporary buffer for supporting the error correction of the next page read, in case the next page read will be read from the next word line down. If the next page indeed is read from the next word line down, the error correction mechanism of controller 20 uses the data of the previous page for enhancing its error correction capability. Such an enhancement is applied straightforwardly in an error correction module that operates using a probabilistic error correction decoding algorithm such as an LDPC algorithm or a Turbo algorithm. The data of the previous page are used by controller 20 to adjust the initial probabilities with which the error correction decoding process starts. The availability of information about the expected coupling effects provides information about the expected errors and may significantly improve the error correction process. Not only does the decoder converge faster, with attendant power and performance benefits, but the range of correctable error scenarios is extended. In other words, some scenarios of error distributions in a page that are not correctable by a probabilistic error correction decoding algorithm when operating blindly on data received from circuit chip 22 become correctable once the coupling data are available and used. In still other words, the average cell error rate that is correctable by a given error correction module is significantly improved by being implemented in conjunction with the new method.

Figure 6:
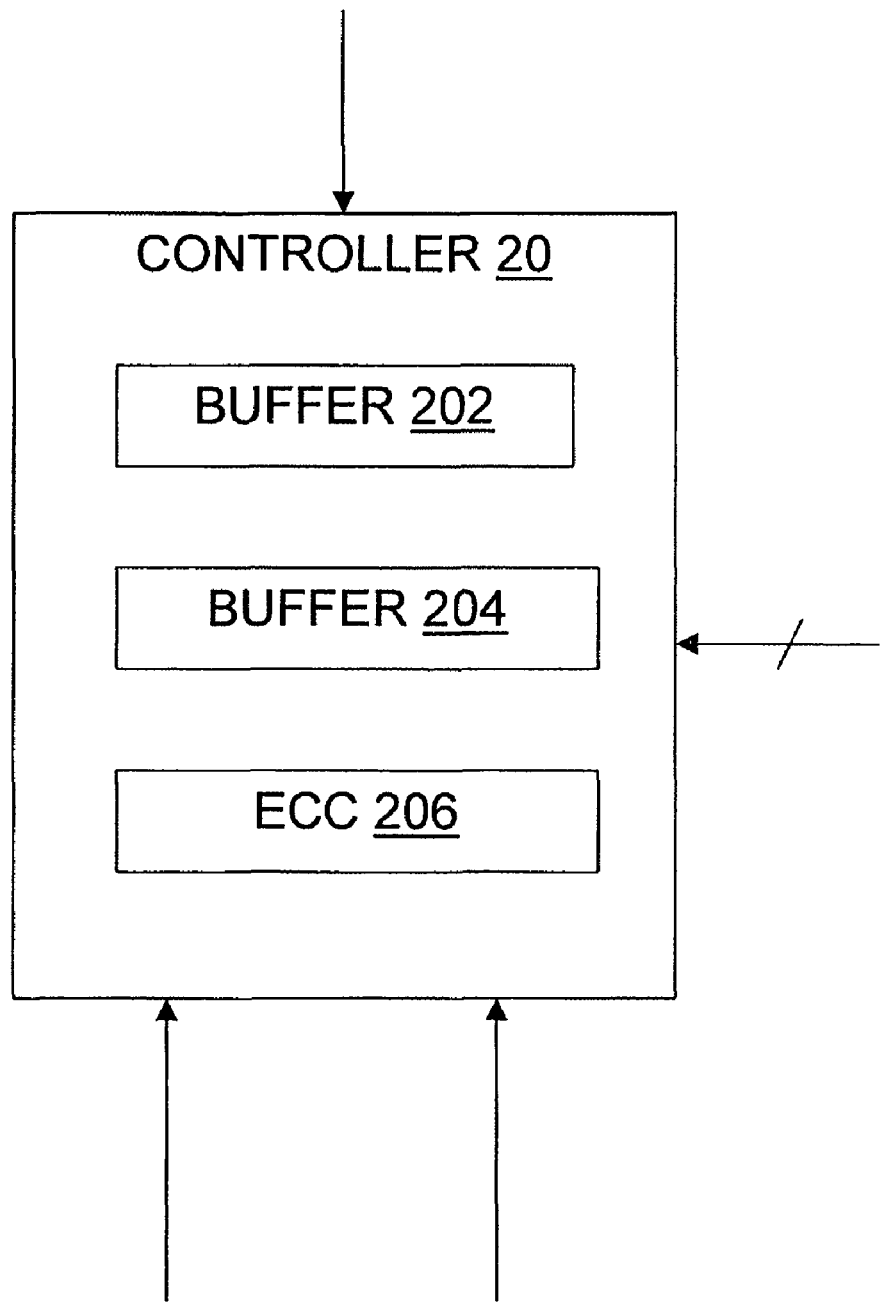

FIG. 6 is an enlarged view of FIG. 1, showing that controller 20 includes two buffers 202 and 204 for storing pages read from successively read word lines and an error correction module 206 for correcting the most recently read page according to the data of the previously read page if the previously read page was read from the word line that was written immediately after the word line of the most recently read page.

Architecture B also may be implemented in a data storage system that emulates controller 20 in software. FIG. 7 is a partial high-level block diagram of such a data storage system 200. Data storage system 200 includes a processor 210 and four memory devices, a RAM 220, a boot ROM 230, a mass storage device (hard disk) 240 and a flash memory device 270, all communicating via a common bus 280. Flash memory device 240 includes a flash memory 260 that is substantially identical to the portion of the flash memory device illustrated in FIG. 1 that is fabricated on 10 circuit chip 22 of FIG. 1 but lacks its own controller. Instead, processor 210 emulates controller 20 by executing driver code 290 that is stored in mass storage device 240. Driver code 290 implements standard flash memory control and also implements the method of architecture B for writing and reading data. Driver code 290 typically is included in operating system code for system 200 but also could be freestanding code. Flash memory device 240 also includes a bus interface 250 to enable processor 210 to communicate with flash memory 260.

Mass storage device 240 is an example of a computer-readable storage medium bearing computer-readable driver code for implementing architecture B in software. Other examples of such computer-readable storage media include read-only memories such as compact disks.

The pages need not be written in strict last-to-first logical page order. The following is an example of the writing of eight pages with logical addresses 0-7 to a flash memory block of four word lines of cells that store two bits per cell according to the encoding of FIG. 3B. The ultimate ordering of the pages is according to the following table:

| Word Line | Most Significant Bit | Least Significant Bit |
|---|---|---|
| WL0 | Page 6 | Page 7 |
| WL1 | Page 4 | Page 5 |
| WL2 | Page 2 | Page 3 |
| WL3 | Page 0 | Page 1 |

If the pages were written in strict last-to-first logical order, then for example logical page 7 first would be written to WL0 by programming the cells that are to store "0" bits to the "10" threshold voltage range while skipping the cells that are to store "1" bits of logical page 7 so that those cells remain in the "11" threshold voltage range. Then logical page 6 would be written to WL0 as follows: Cells that are to store a "1" of logical page 7 and a "1" of logical page 6 are skipped, as are cells that are to store a "0" of logical page 7 and a "1" of logical page 6. Cells that are to store a "0" of logical page 7 and a "0" of logical page 6 are raised from the "10" threshold to voltage range to the "00" threshold voltage range. Cells that are to store a "1" of logical page 7 and a "0" of logical page 6 are raised from the "11" threshold voltage range to the "01" threshold voltage range. Then logical pages 5 and 4 would be written to WL1 similarly. Then logical pages 3 and 2 would be written to WL2 similarly. Finally, logical pages 1 and 0 would be written to WL3 similarly.

But the pages need not be written in strict last-to-first logical order. The following writing order also is suitable:

Write logical page 7 to the least significant bits of WL0.

Then write logical page 5 to the least significant bits of WL1.

Then write logical page 6 to the most significant bits of WL0.

Then write logical page 3 to the least significant bits of WL2.

Then write logical page 4 to the most significant bits of WL1.

Then write logical page 1 to the least significant bits of WL3.

Then write logical page 2 to the most significant bits of WL2.

Finally, write logical page 0 to the most significant bits of WL3.

A limited number of embodiments of methods for writing and reading data in a flash memory, and of a device and system that use the methods, have been described. It will be appreciated that many variations, modifications and other applications of the methods, device and system may be made.

What is claimed is:

1. A method of storing data organized into a plurality of pages that are ordered according to a logical page address order, comprising:
   receiving the plurality of pages of data;
   storing the plurality of pages of data in one or more cache blocks of a memory cell array; and
   writing the plurality of pages of data from the one or more cache blocks to a long-term storage block of the memory cell array, the long-term storage block having a plurality of word lines that are written successively in a word line writing order;
   wherein writing the plurality of pages of data includes writing to each word line at least one page of data having a higher logical page address than any page of data that is written to any subsequently written word line.

2. A method according to claim 1, wherein:
   the one or more cache blocks includes a plurality of memory cells;
   the long-term storage block includes a plurality of memory cells;
   storing the plurality of pages of data in the one more cache blocks includes storing a first number of bits in each memory cell of the one or more cache blocks; and
   writing the plurality of pages of data to the long-term storage block includes storing a second number of bits in each memory cell of the long-term storage block, the second number of bits being larger than the first number of bits.

3. A method according to claim 1, wherein:
   the one or more cache blocks each include a plurality of word lines that are written successively in a word line writing order;
   receiving the plurality of pages of data includes receiving the plurality of pages in the logical page address order beginning with a lowest logical page address and ending with a highest logical page address; and
   storing the plurality of pages of data in the one or more cache blocks includes writing to each word line of a particular cache block at least one page of data having a lower logical page address than any page of data that is written to any subsequently written word line.

4. A method according to claim 1, further comprising:
   reading from at least two of the word lines sequentially according to the logical page address order of pages stored therein; and
   for each word line of the at least two word lines that is read subsequent to the reading of a first of the at least two word lines, reading the data of the each word line in accordance with the data from the word line of the at least two word lines that is read immediately prior to the each word line.

5. A method of reading data in a memory device, comprising:
   providing a memory that includes a block, the block including a plurality of word lines that are written in a word line writing order such that each page of data written to a word line has a higher logical page address than any page of data that is written to any subsequently written word line;
   reading a first page of data from a first word line of the block, the first word line being written subsequent to a second word line according to the word line writing order;
   providing the first page of data to a host;
   storing the first page of data in a temporary buffer at the memory device;
   reading a second page of data from the second word line of the block subsequent to reading the first page of data; and
   applying error correction to the second page of data based on the first page of data in the temporary buffer.

6. A method according to claim 5, further comprising:
   applying error correction to the first page of data before providing the first page of data to the host or storing the first page of data in the temporary buffer.

7. A method according to claim 5, further comprising:
   providing the second page of data to the host after providing the first page of data to the host.

8. A method according to claim 5, wherein:
   applying error correction to the second page of data includes adjusting initial probabilities used to start the error correction based on the first page of data.

9. A method of storing data in a memory device, comprising:
- receiving a plurality of pages of data that are ordered according to a logical page address order; and
- writing the plurality of pages to a block of memory cells, the block including a plurality of word lines that are written in a word line writing order beginning with a first word line and ending with a last word line of the block;
- wherein writing the plurality of pages includes writing at least two pages of data to each word line of the block such that each page that is written to a word line has a higher logical page address than any page that is written to any subsequently written word line.

10. A method according to claim 9, wherein writing the plurality of pages to the block of memory cells includes:
- writing a first page of data to the first word line;
- writing a second page of data to a second word line that is adjacent to the first word line after writing the first page of data, the second page of data having a lower logical page address than the first page of data;
- writing a third page of data to the first word line after writing the second page of data to the second word line, the third page of data having a higher logical page address than the second page of data and a lower logical page address than the first page of data;
- writing a fourth page of data to a third word line that is adjacent to the second word line after writing the third page of data, the fourth page of data having a logical page address that is lower than the second page of data; and
- writing a fifth page of data to the second word line after writing the fourth page of data, the fifth page of data having a logical page address that is lower than the second page of data and higher than the fourth page of data.

* * * * *